(12) United States Patent
Rafael, Jr. et al.

(10) Patent No.: US 11,538,768 B2
(45) Date of Patent: Dec. 27, 2022

(54) LEADFRAME WITH GROUND PAD CANTILEVER

(71) Applicant: Texas Instruments Incorporated, Dallas, TX (US)

(72) Inventors: Ernesto Pentecostes Rafael, Jr., Nueva Ecija (PH); Dolores Babaran Milo, Baguio (PH); Michael Flores Milo, Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 294 days.

(21) Appl. No.: 16/592,833

(22) Filed: Oct. 4, 2019

(65) Prior Publication Data
US 2021/0104471 A1 Apr. 8, 2021

(51) Int. Cl.
| | |
|---|---|
| *H01L 23/495* | (2006.01) |
| *H01L 23/00* | (2006.01) |
| *H01L 23/31* | (2006.01) |
| *H01L 21/78* | (2006.01) |
| *H01L 21/48* | (2006.01) |
| *H01L 21/56* | (2006.01) |

(52) U.S. Cl.
CPC ........ *H01L 23/562* (2013.01); *H01L 21/4825* (2013.01); *H01L 21/565* (2013.01); *H01L 21/78* (2013.01); *H01L 23/3114* (2013.01); *H01L 23/4952* (2013.01); *H01L 23/49503* (2013.01); *H01L 23/49548* (2013.01); *H01L 23/49582* (2013.01)

(58) Field of Classification Search
CPC ............ H01L 23/49503; H01L 23/495; H01L 23/49548
USPC .................................................. 257/666, 676
See application file for complete search history.

(56) References Cited

U.S. PATENT DOCUMENTS

| | | | | |
|---|---|---|---|---|
| 5,021,865 | A * | 6/1991 | Takahashi | H01L 23/49503 257/676 |
| 6,087,715 | A * | 7/2000 | Sawada | H01L 23/3142 257/676 |
| 6,281,568 | B1 * | 8/2001 | Glenn | H01L 23/4951 257/796 |
| 6,713,849 | B2 * | 3/2004 | Hasebe | H01L 23/49 257/667 |
| 7,049,683 | B1 * | 5/2006 | Sirinorakul | H01L 24/48 257/667 |
| 7,087,462 | B1 * | 8/2006 | Park | H01L 24/97 438/461 |
| 7,808,084 | B1 * | 10/2010 | Lee | H01L 23/49503 257/676 |
| 9,761,536 | B1 | 9/2017 | Milo et al. | |
| 9,978,695 | B1 * | 5/2018 | Bae | H01L 23/49548 |

(Continued)

*Primary Examiner* — Nitin Parekh
(74) *Attorney, Agent, or Firm* — Ronald O. Neerings; Frank D. Cimino

(57) ABSTRACT

An electronic device includes a die attach pad with a set of cantilevered first leads for down bond connections, a set of second leads spaced apart from the die attach pad, a semiconductor die mounted to the die attach pad and enclosed by a package structure, a set of first bond wires connected between respective bond pads of the semiconductor die and at least some of the first leads, and a set of second bond wires connected between respective further bond pads of the semiconductor die and at least some of the second leads.

20 Claims, 11 Drawing Sheets

(56) References Cited

U.S. PATENT DOCUMENTS

2012/0126378 A1\* 5/2012 San Antonio ......... H01L 23/552
　　　　　　　　　　　　　　　　　　　　　257/659
2017/0278776 A1　9/2017 Milo et al.
2018/0182642 A1　6/2018 Milo et al.

\* cited by examiner

LEADFRAME WITH GROUND PAD CANTILEVER

BACKGROUND

Many packaged electronic devices include a die with one or more electronic components mounted to a die pad or die attach pad (DAP) within a molded package structure. Bond wires connect bond pads of the die with leads that provide external access for soldering to a host printed circuit board (PCB). Additional bond wires connect further bond pads of the die to a ground ring area of the die pad for grounding or down bonding. However, delamination of the mold material from the ground ring area can reduce bond wire connection or stitch integrity, for example, corroded stitches, lifted stitches, short tail problems, etc., for down bond wires bonded to the ground ring area. Interfaces between different materials are prone to delamination or separation, particularly during temperature cycling. Delamination can be caused by different material characteristics, such as thermal expansion, and other factors related to an assembly process. Delamination often results from mismatches between coefficient of thermal expansion (CTE) between interfaces, such as die to lead frame, die to mold, and lead frame to mold. Connection areas of the ground ring can be selectively plated to enhance stitch integrity, but this adds cost to the product. Addition of dimples to the die attach pad can reduce delamination effects, but this increases the cost of the lead frame.

SUMMARY

One aspect of the disclosure involves an electronic device that includes a semiconductor die mounted to a die attach pad within a package structure. The die attach pad includes a set of cantilevered first leads that extend outward from a side of the die attach pad within the package structure. The electronic device also includes second leads spaced apart from the die attach pad and exposed along a corresponding side of the package structure. A set of first bond wires are connected between a respective bond pad of the semiconductor die and a respective one of the first leads of the die attach pad. The device also includes a set of second bond wires connected between respective further bond pads of the semiconductor die and at least some of the second leads. In one aspect, the die attach pad includes first leads that extend outward from multiple sides of the die attach pad within the package structure. In another aspect, the some of the first leads extend outward from the side of the die attach pad at a non-zero angle to others of the first leads. In another aspect, the first and second leads include a plated side. In another aspect, the first and second leads include a roughened surface. In another aspect, the die attach pad includes a recess between adjacent ones of the cantilevered first leads. In another aspect, the die attach pad includes a second recess between adjacent ones of the cantilevered first leads and a die support portion of the die attach pad.

Another aspect of the disclosure relates to a lead frame that includes die attach pad with a set of cantilevered first leads that extend outward from a side of the die attach pad, and a set of second leads spaced apart from the die attach pad. In one aspect, the die attach pad includes first leads that extend outward from multiple sides of the die attach pad. In one aspect, the die attach pad includes first leads that extend outward from multiple sides of the die attach pad within the package structure. In another aspect, the some of the first leads extend outward from the side of the die attach pad at a non-zero angle to others of the first leads. In another aspect, the first and second leads include a plated side. In another aspect, the first and second leads include a roughened surface. In another aspect, the die attach pad includes a recess between adjacent ones of the cantilevered first leads. In another aspect, the die attach pad includes a second recess between adjacent ones of the cantilevered first leads and a die support portion of the die attach pad.

A further aspect of the disclosure relates to a method that includes providing a lead frame that includes a die attach pad with a set of cantilevered first leads that extend outward from a side of the die attach pad, and a set of second leads spaced apart from the die attach pad. The method also includes attaching a semiconductor die to the die attach pad of the lead frame. The method further includes attaching a set of first bond wires between respective bond pads of the semiconductor die and at least some of the cantilevered first leads of the die attach pad, and attaching a set of second bond wires between respective further bond pads of the semiconductor die and at least some of the second leads. The method also includes enclosing the semiconductor die, a portion of the die attach pad, the cantilevered first leads, first portions of the second leads, and the first and second bond wires in a package structure that exposes second portions of the second leads. In one aspect, the method also includes separating respective ones of the second leads from one another and exposing the second portions of the second leads along a side of the package structure. In a further aspect, the method includes plating a side of the lead frame before performing the die attach process.

DETAILED DESCRIPTION

Figure 1:
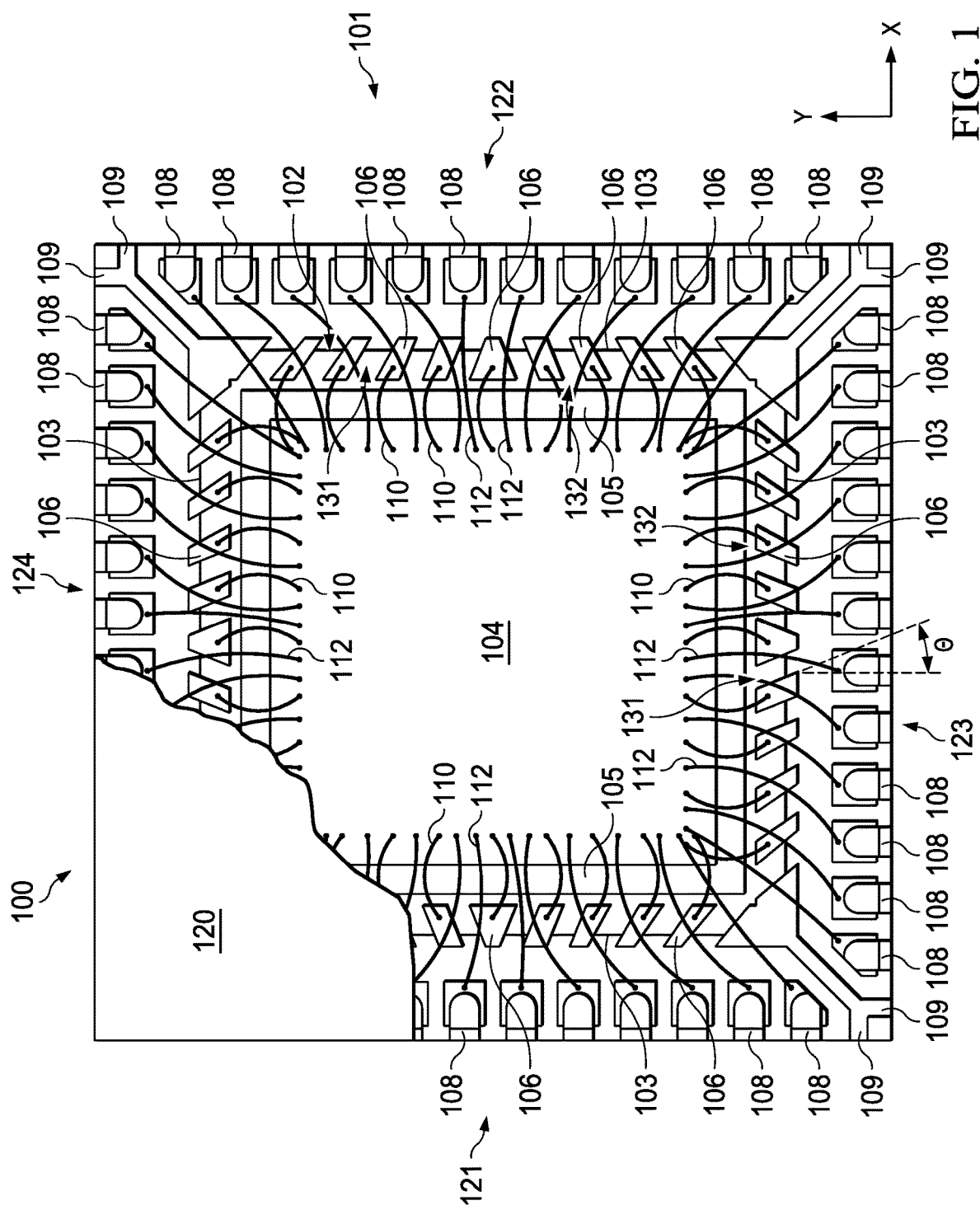
FIG. 1 is a top cutaway view of a package electronic device with cantilevered die pad leads for down bonding according to one embodiment.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

FIG. 1 shows a packaged electronic device 100, such as an integrated circuit with multiple electronic components (e.g., transistors, resistors, capacitors or combinations thereof), or a packaged device with a single electronic component. The example electronic device 100 of FIG. 1 includes structures fabricated using a starting lead frame 101. The lead frame 101 and the starting portions thereof can be any suitable material, such as copper or a material that includes copper. Various copper alloy materials can be used, such as EFTEC64T and CDA194. The electronic device 100 includes a rectangular (e.g., square) die attach pad 102 with four sides 103. A semiconductor die 104 is mounted to a die support portion 105 of the die attach pad 102. The semiconductor die 104 includes a first (e.g., bottom) side mounted to the die support portion 105 of the die attach pad 102, and a second (e.g., top) side with conductive bond pads electrically connected to a circuit or component of the semiconductor die 104.

The die attach pad 102 also includes a set of cantilevered first leads 106. The first leads 106 are cantilevered, meaning that the individual first leads are supported by the die attach pad 102 on only one end of the first lead, and the remaining three sides thereof are not mechanically or structurally supported by (i.e., not in contact with) the die attach pad 102. Respective ones of the cantilevered first leads 106 extend outward from a corresponding side 103 of the die attach pad 102. The example electronic device 100 of FIG. 1 is a four-sided flat no-leads package (e.g., a quad-flat no-leads (QFN) package). The concepts of the present disclosure can be used in other types and forms of electronic device packages, such as dual-flat no-leads (DFN) packages, micro lead frame (MLF) packages, small outline no leads (SON) packages, or other surface mount and non-surface mount electronic device package types and/or forms. In the QFN example 100 of FIG. 1, the die attach pad 102 includes first leads 106 that extend outward from multiple sides 103 of the die attach pad 102. Other implementations are possible in which first leads 106 are provided on only a single side 103 of the die attach pad 102, or on a different number of multiple sides 103 of the die attach pad 12.

The electronic device 100 also includes a set of second leads 108 spaced apart (e.g., laterally outward) from the die attach pad 102. The example electronic device 100 in FIG. 1 includes second leads 108 on all four sides of the packaged device, although not a strict requirement of all possible implementations. In this example, the die attach pad 102 includes ground connection structures 109 that individually extend towards corresponding corners of the device 100, for example, to provide externally accessible ground connections for soldering to a host printed circuit board (PCB), not shown. The electronic device 100 further includes a set of first bond wires 110 connected between respective bond pads of the semiconductor die 104 and at least some of the first leads 106 of the die attach pad 102. A set of second bond wires 112 are individually connected between respective further bond pads of the semiconductor die 104 and at least some of the second leads 108.

The electronic device 100 further includes a package structure 120, such as a molded material. In other examples, a ceramic package material can be used. FIG. 1 is a partial cutaway top plan view of the electronic device 100, wherein only a portion of the package structure 120 is illustrated (e.g., in the upper left portion in FIG. 1). The package structure 120 includes a first side 121 (e.g., the left side in the top view of FIG. 1), a second side 122 spaced apart from the first side 121 along a first direction X (e.g., the right side in FIG. 1), a third side 123 (e.g., the lower side in FIG. 1), and a fourth side 124 (e.g., the upper side) spaced apart from the third side 123 along a second direction Y that is orthogonal to the first side X. Some of the first leads 106 in the example of FIG. 1 extend outward from the side 103 of the die attach pad 102 along one of the first direction X and the second direction Y. Other ones of the first leads 106 extend outward from the side 103 of the die attach pad 102 at a non-zero angle θ to the direction X or Y.

The package structure 120 in this example encloses the die attach pad 102, the semiconductor die 104, the set of first leads 106, and the bond wires 110 and 112. In this example, moreover, the package structure 120 exposes (e.g., provides external access to) portions of the second leads 108 and portions of the ground connection structures 109, which are exposed along a corresponding one of the sides 121-124 of the package structure 120. In this example, the exposed portions of the second leads 108 and the ground connection structures 109 are exposed along the sides 121-24, and portions of the bottom (not shown) of the packaged electronic device 100, although not a strict requirement of all possible implementations. The illustrated QFN structure facilitates soldering of the packaged electronic device 100 to a host PCB (not shown) to provide electrical connection of circuits or components within the die 104 with circuitry of the host PCB. In one implementation, the package structure 120 also provides external access to (e.g., exposure of) a bottom portion of the die attach pad 102, for example, for external ground connection to a host PCB and/or to facilitate thermal cooling (e.g., heat transfer) from the semiconductor die 104 to the host PCB, although not a strict requirement of all possible implementations.

The cantilevered first leads 106 improve down bond stitch integrity by helping to reduce delamination of the material of the package structure 120 from the die attach pad 102. Using this construction provides cost advantages compared with selective plating of areas to be connected with the down bond first leads 106. The disclosed examples also provide cost and complexity advantages with respect to addition of dimples or other non-planar surface features on the die attach pad 102. The cantilevered design in certain examples reduces the interface between the molded material of the package structure 120 and the die attach pad portion 102 of the lead frame 101. The cantilevered leads 106 effectively provide additional mold locking features to the die attach pad 102 during fabrication to reduce the likelihood of delamination in subsequent manufacturing steps or in operation of the finished packaged electronic device 100. This aspect of the presently disclosed examples helps eliminate delamination without the additional cost and process complexity of selective plating. In certain examples, the cantilevered leads 106 are created during fabrication of the starting lead frame 101, for example, by selective chemical etching during the creation of other structural features of the lead frame 101, and thus the disclosed examples do not add to production costs.

In the illustrated example, the starting lead frame 101 is not plated prior to use in fabrication of the electronic device one hundred. In other examples, the respective first leads 106 and the respective second leads 108 include a plated side. In one possible implementation, the starting lead frame 101 is fully plated, for example, with a plating material that is or includes nickel-palladium-gold (NiPdAu). In another possible implementation, selective plating is performed on the starting lead frame 101, and the bonding portions of the leads 106 and 108 are selectively plated to facilitate stitch attachment during wire bonding. In this example, the first bond wires 110 are connected to the plated sides of the respective first leads 106, and the second bond wires 112 are connected to the plated sides of the respective second leads 108. Full plating can lessen the cost impact compared with selective plating but increases the likelihood of delamination of the plated surface from the molded package material. If used, plating can be done with any suitable materials. In one implementation, the plated sides of the respective first leads 106 and the plated sides of the respective second leads 108 include nickel-palladium-gold. In another example, the starting lead frame 101, or portions thereof, is plated with spot silver (Ag) plating.

In certain examples, the starting lead frame 101, including the structures and features 102, 103, 105, 106 and 108 is a generally planar or flat structure. In the example of FIG. 1, the starting lead frame 101 includes half etch portions created during manufacturing of the lead frame 101. In one example, the starting lead frame 101 includes step features to facilitate mold locking during molding operations to create the package structure 120. In this example, portions of the die attach pad 102 and the second leads 108 are selectively etched during manufacturing of the lead frame 101 in order to create a two-level upper surface, including raised portions and one or more recesses. The example die attach pad 102 in FIG. 1 includes a recess 131 between adjacent ones of the cantilevered first leads 106, as well as a second recess 132 between the cantilevered first leads 106 and the die support portion 105 of the die attach pad 102. This creates a multilevel structure in which the die support portion 105 and the first leads 106 are raised relative to the recessed portions 131 and 132. In this example, moreover, the second leads 108 include both raised and recessed portions as shown in FIG. 1, as well as in FIG. 6 below. In other implementations, no recesses are provided. In practice, the recesses 131 and/or 132 facilitate mold locking to reduce or mitigate delamination or separation of the mold material from the die attach pad 102 and/or from the second leads 108.

In one implementation, the starting lead frame 101 as essentially smooth surfaces. In another implementation, one or more sides or features of the starting lead frame 101 (and hence the finished die attach pad 102 and second leads 108) include full or partially roughened outer surfaces. Surface roughening can be used alone or in combination with selective or full plating in various implementations to provide a controlled profile of the lead frame surface or select portions thereof. Roughening can help reduce or avoid package delamination or separation, for example, when the electronic device 100 is exposed to moisture and numerous temperature cycles. One suitable surface roughening technique is a single side thermal non-delamination (non-delam) (SSTN) process, which can be applied for in one example to NiPdAu plated lead frames. One possible implementation, the nickel (Ni) layer is roughened before Pd and Au plating application following the contour of the roughened Ni. Another roughening type is roughened copper (e.g., referred to as Cu rough), and which an exposed area of a selective plated lead frame is roughened using a chemical process. In this process, the chemical only attacks the Cu area, leaving the plated material a smooth surface. The selectively roughened outer surface of the starting lead frame 101 in this example facilitates adhesion to the subsequently molded material of the package structure 120, while facilitating adherence of wire bonding stitches to the plated areas of the lead frame 101. In particular, surface roughening increases the effective surface area, where the micro-structures of a roughened surface serve as mold locking feature to enhance mold to lead frame adhesion. In one implementation, non-plated sides of the respective first leads 106 and the plated sides of the respective second leads 108 include a roughened surface.

Figure 2:
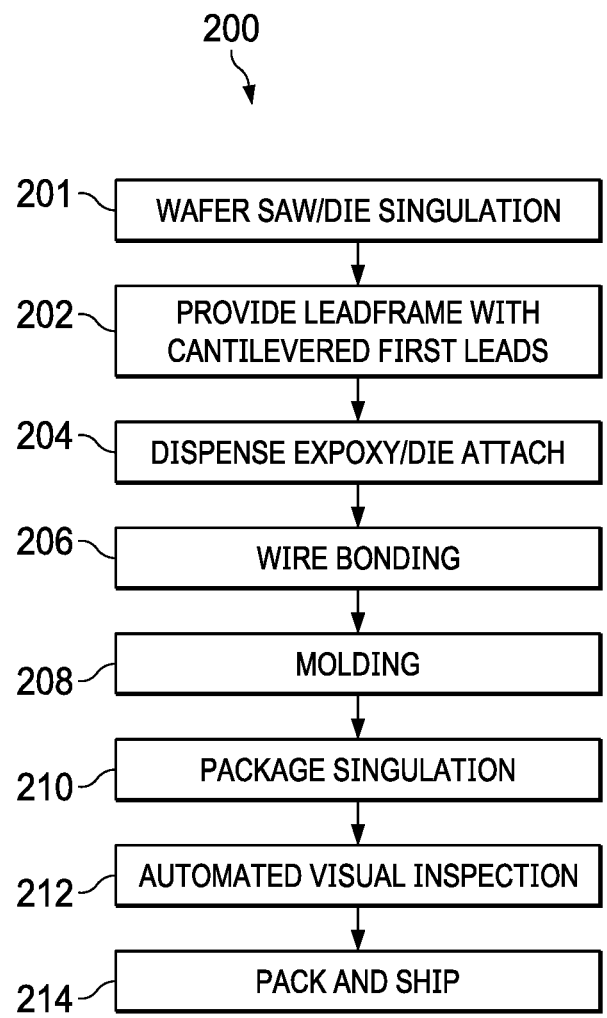
FIG. 2 is a flow diagram of a method to fabricate a packaged electronic device.

Referring also to FIGS. 2-8, FIG. 2 shows an example method 200 to fabricate a packaged electronic device and FIGS. 3-8 show the example electronic device 100 of FIG. 1 at various stages of fabrication according to the method 200 of FIG. 2. The method 200 is illustrated beginning with a processed wafer (e.g., silicon), including one or more electronic components previously fabricated in each of a number of different die locations of the processed wafer, along with a metallization structure providing one or more conductive bond pads at an exposed top side of the individual die areas. At 201 in FIG. 2, the starting wafer is separated or singulated (e.g., by sawing) to provide two or more semiconductor dies (e.g., die 104 in FIG. 1 above).

Figure 3:
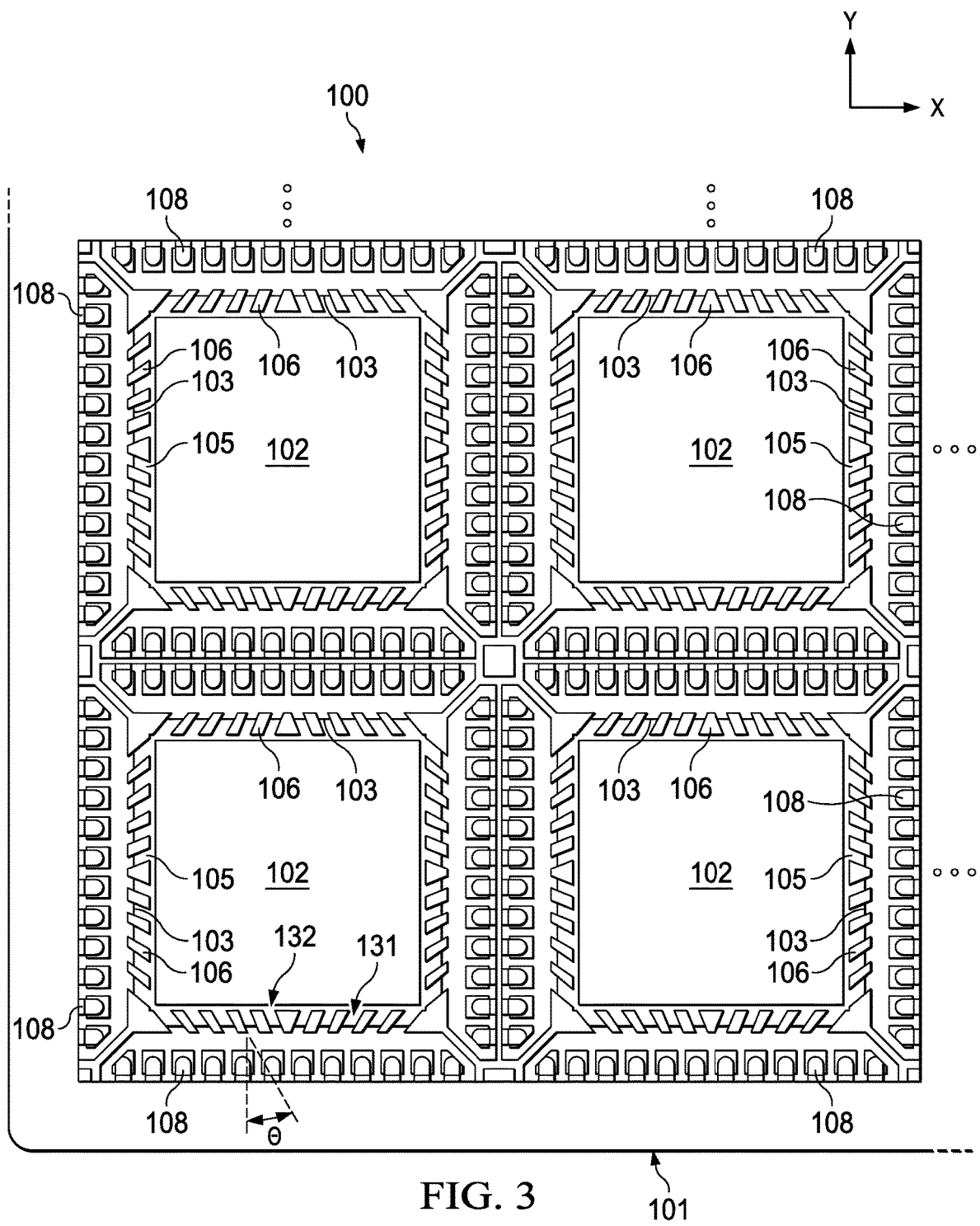
FIG. 3 is a partial top plan view of a lead frame with cantilevered die pad leads for down bonding.

The method 200 further includes providing a lead frame at 202 with cantilevered first leads (e.g., leads 106 in FIG. 1). FIG. 3 shows one example of a portion of a starting lead frame 101. The lead frame 101 includes multiple sections that individually correspond to a respective final device after fabrication and package separation, four of which are shown in FIG. 3 in a corner portion of a lead frame panel. Each of the panel sections in this example includes a die attach pad 102 with cantilevered first leads 106 extending outward from the four sides 103 for down bonding and subsequent fabrication steps, as well as a center die support portion 105. In addition, the individual lead frame panel sections include a set of second leads 108 on each of the four sides, which are spaced apart outwardly from the die attach pad 102. The lead frame can be fabricated using a variety of different lead frame manufacturing processes and techniques. In one example, the lead frame 101 is provided at 202 as a generally flat or planar structure. In another example, the starting lead frame 101 includes one or more recessed portions (e.g., 131 and/or 132 in FIG. 3). In certain implementations, the lead frame includes one or more plated surfaces, and may also or alternatively include one or more roughened surfaces as described above. Certain implementations can also include one or more dimples or other surface features to facilitate adherence to molded materials to thereby mitigate or avoid delamination.

Figure 4:
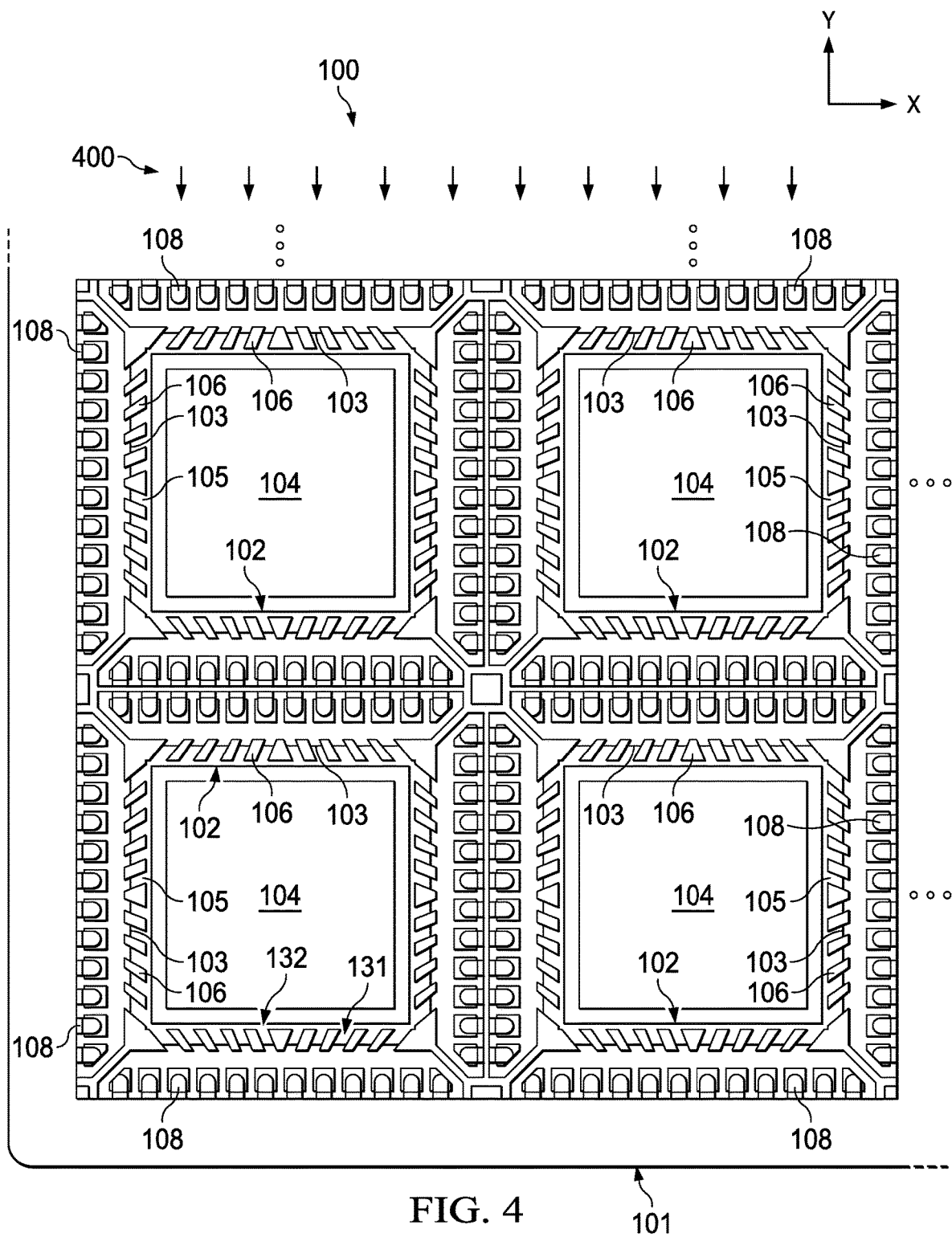
FIG. 4 is a partial top plan view of the lead frame of FIG. 3 undergoing a die attach process.

The method 200 also includes performing a die attach process at 204 in FIG. 2. FIG. 4 shows one example, in which a die attach process 400 is performed that attaches the semiconductor die 104 to the die support portion 105 of the die attach pad 102 of the lead frame 101. The die attach process 400 in one example includes initial dispensing or other deposition of epoxy material (not shown) in the die support portions 105 of the individual die pads 102, followed by placement (e.g., automatic pick and place robotic processing) to place respective singulated semiconductor dies 104 on the epoxy in the associated die support portions 105, as shown in FIG. 4. The example die attach process 400 also includes subsequent epoxy curing steps, for example, using thermal annealing or other suitable process. In one example, the semiconductor dies 104 include one or more conductive thermal pads that are soldered to the conductive die support portions 105, although not required for all possible implementations.

Figure 5:
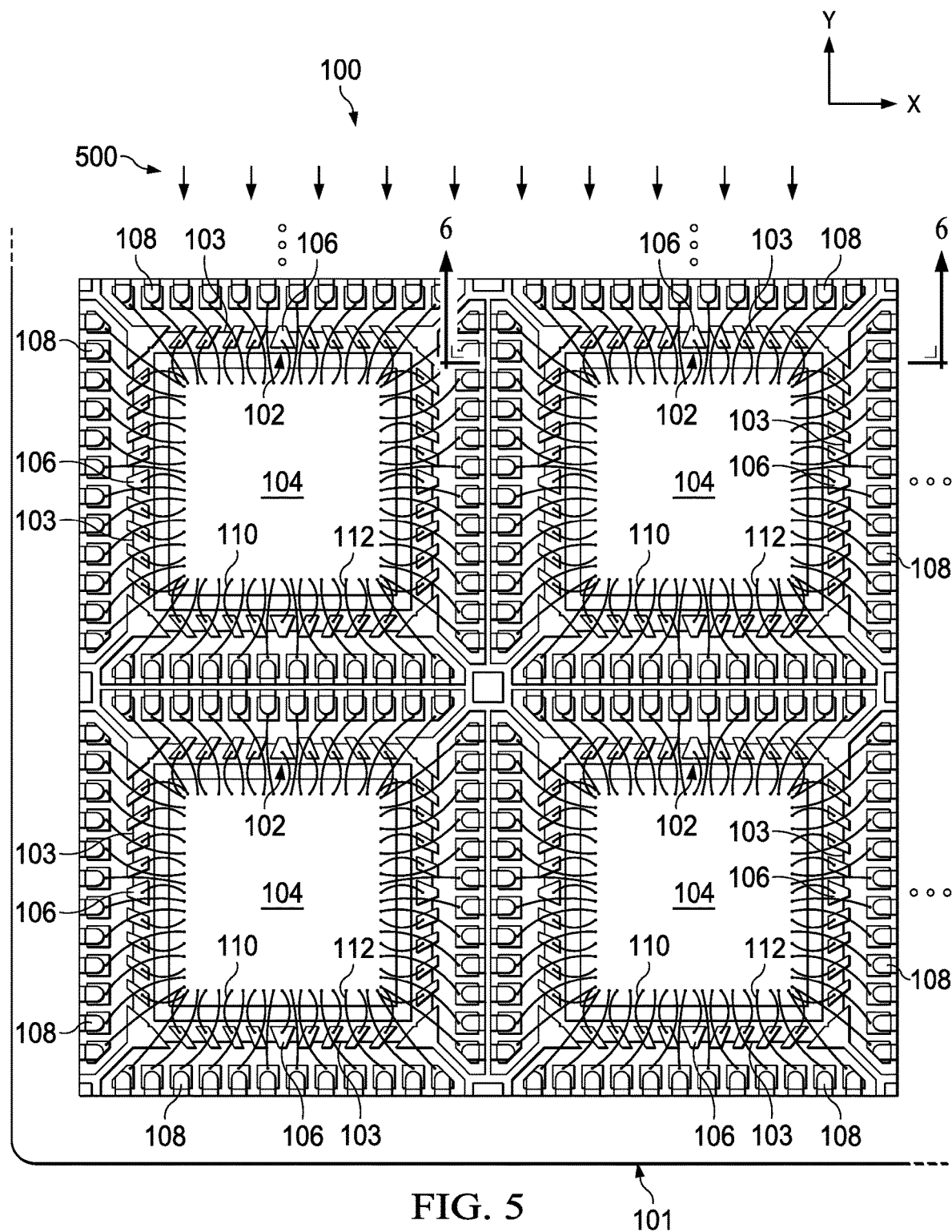
FIG. 5 is a partial top plan view of the lead frame of FIGS. 3 and 4 undergoing a wire bonding process.
Figure 6:
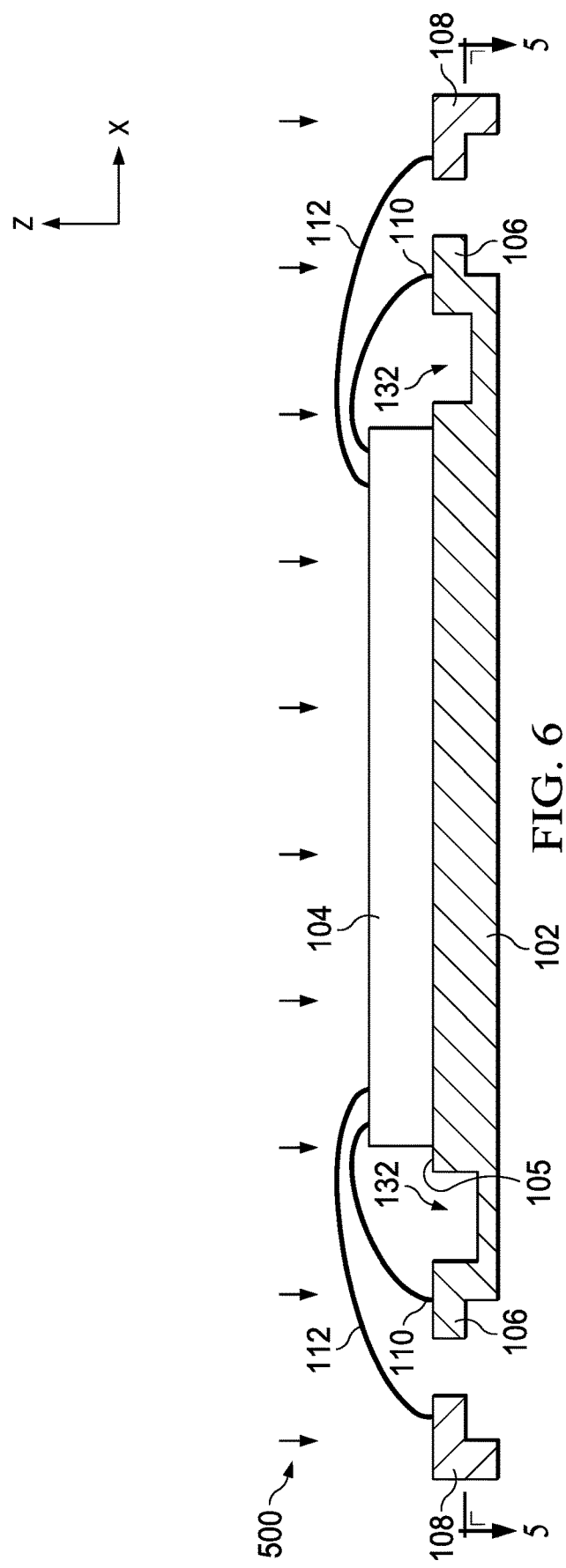
FIG. 6 is a partial sectional side elevation view of a portion of the lead frame taken along line 6-6 in FIG. 5.

The method 200 continues at 206 in FIG. 2 with wire bonding. FIGS. 5 and 6 respectively show top and sectional side views of a portion of the lead frame panel 101 undergoing a wire bonding process 500. In this example, the wire bonding process 500 attaches the first bond wires 110 between respective bond pads of the semiconductor die 104 and at least some of the cantilevered first leads 106. In addition, the process 500 attaches the second bond wires 112 between respective further bond pads of the semiconductor die 104 and at least some of the second leads 108. In one example, the wire bonding process 500 uses gold (Au), copper (Cu) or palladium coated copper (PCC) wires of any suitable diameter(s), such as 0.8 mils, 0.96 mils, 1.3 mils or 2.0 mils in a three step process that includes first bond or ball formation, loop formation, and second bond or stitch formation using a capillary bonding tool that holds and controls the bond wire 110, 112 during the wire bonding process 500. In another example, wedge bonding can be used.

Figure 7:
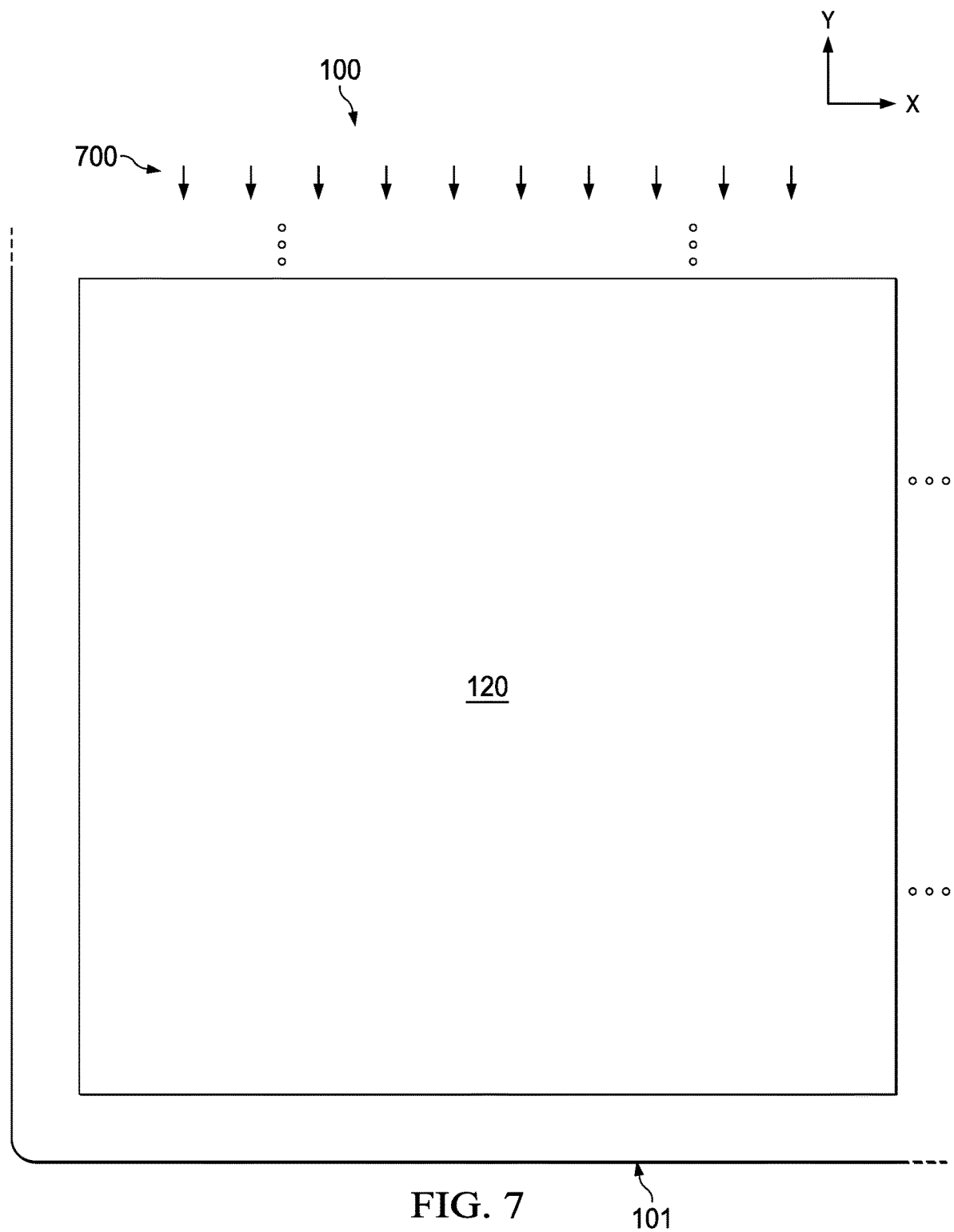
FIG. 7 is a partial top plan view of the lead frame of FIGS. 3-6 undergoing a molding process.
Figure 8:
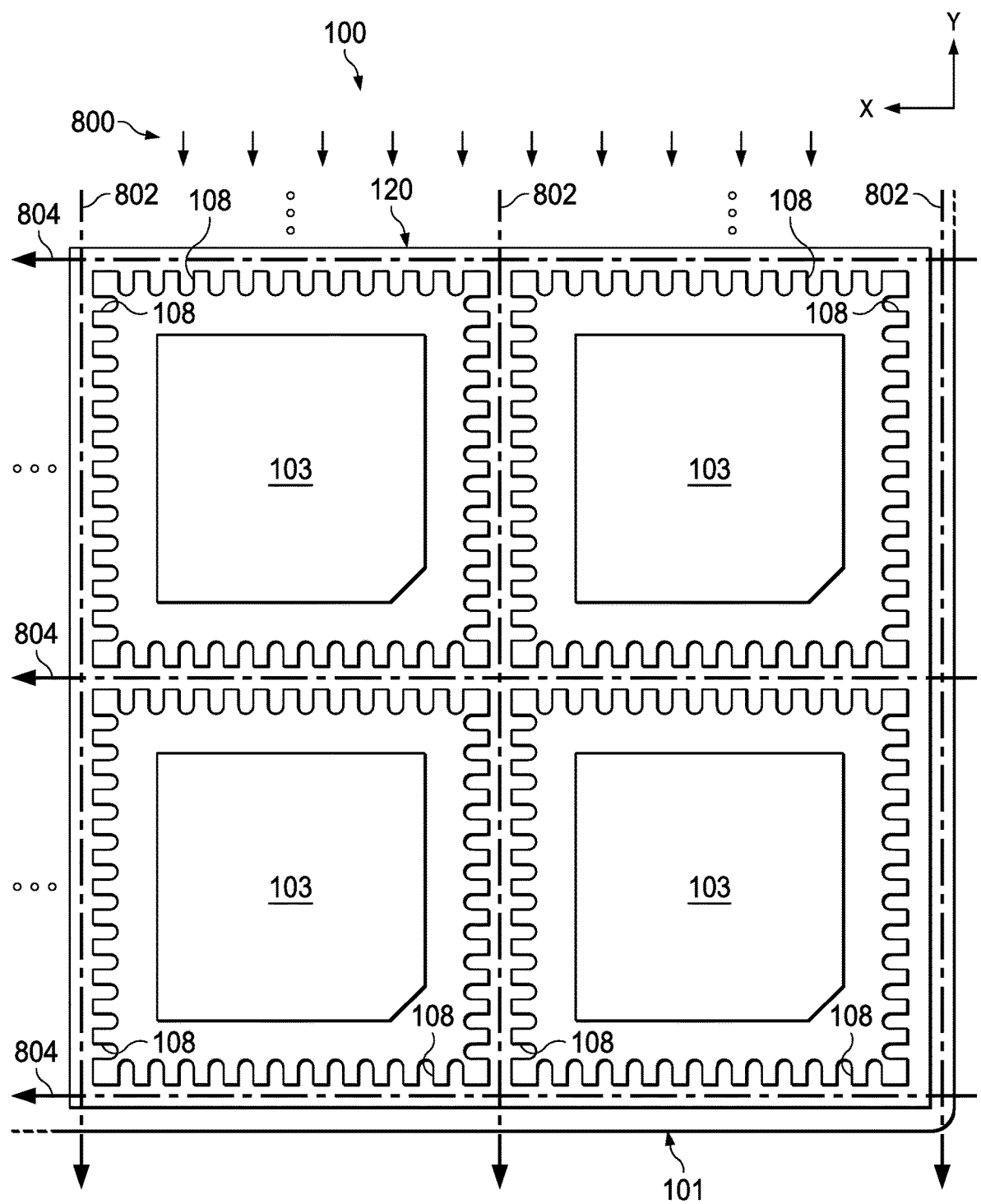
FIG. 8 is a partial top plan view of the lead frame of FIGS. 3-7 undergoing a package singulation process.

The method 200 continues at 208 in FIG. 2 with molding to form the package structure. FIG. 7 shows an example in which a molding process 700 is performed that encloses the semiconductor die 104, a portion of the die attach pad 102, the cantilevered first leads 106, first portions of the second leads 108, and the first and second bond wires 110, 112 in a molded package structure 120 that exposes second portions of the second leads 108 along a bottom side. At 210 in FIG. 2, a package singulation process is performed to separate individual electronic devices 100 from one another and exposes side portions of the second leads 108. FIG. 8 shows an example of a package singulation saw process 800 that cuts through the molded package structure 120 and separates respective ones of the second leads 108 from one another between the individual die sections of the lead frame panel along saw path lines 802 in the Y direction, and then along saw path lines 804 in the X direction to create the package sides 121-124 (FIG. 1) and to expose the laterally outward second portions of the second leads 108. The example method 200 also includes automated visual inspection at 212, followed by packing and shipment at 214.

The example lead frame 101 and the electronic device 100 with the cantilevered first leads 106, along with the fabrication method 200, address delamination of the interface between the lead frame portions and the mold material interface. Reducing delamination at this interface mitigates or avoids bond integrity issues on wires bonded to the ground area or down bonds. Unlike other approaches (e.g., selective plating, additional dimples) that raise product cost and increase manufacturing complexity to achieve better delamination reliability, the disclosed examples provide a solution that retains process simplicity and economy while improving reliability at a lower cost through the application of lead frame 101 with cantilevered die pad leads 106.

Figure 9:
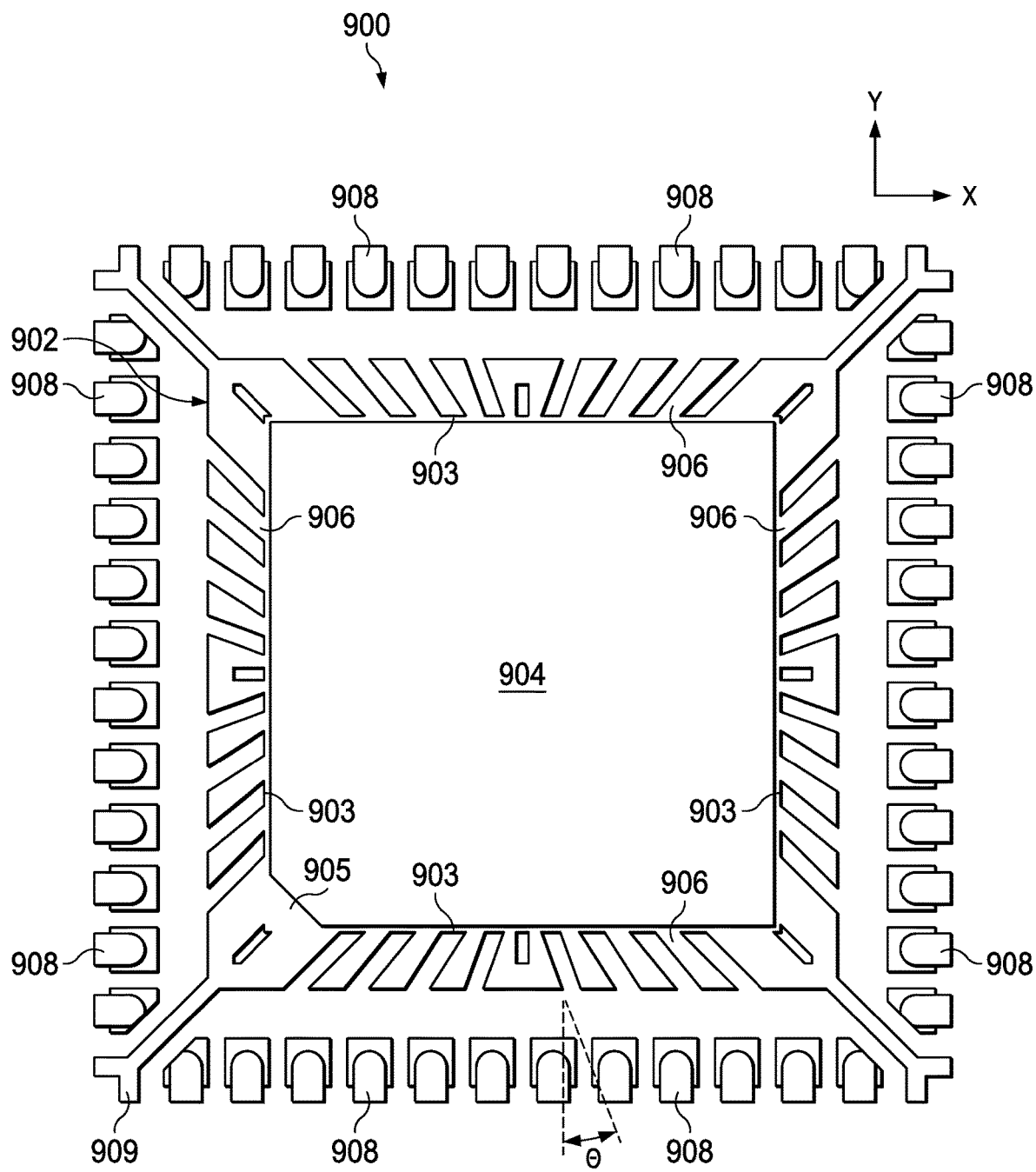
FIG. 9 is a partial top plan view of another example lead frame with cantilevered die pad leads according to another embodiment.
Figure 10:
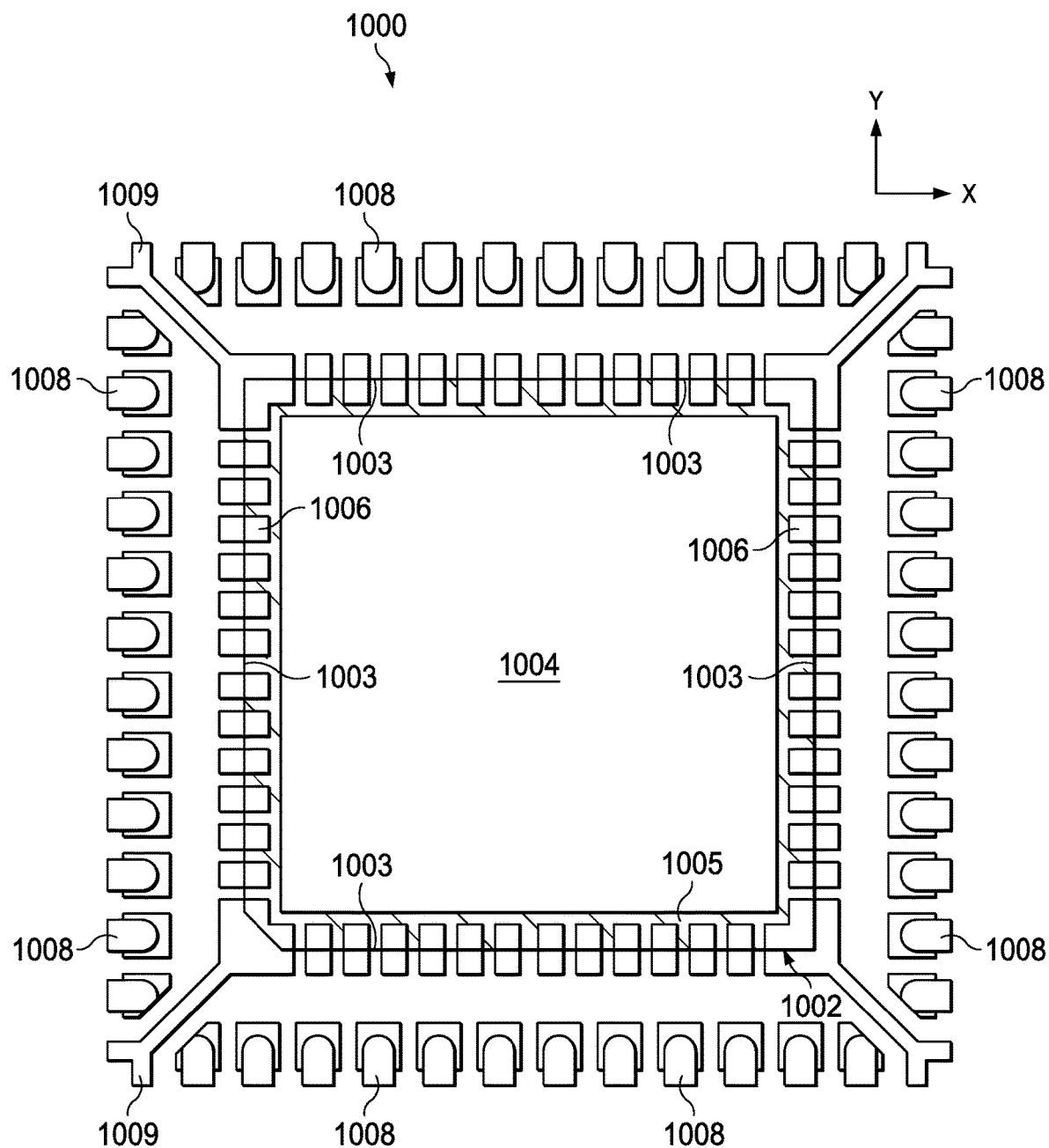
FIG. 10 is a partial top plan view of yet another example lead frame with cantilevered die pad leads according to a further embodiment.
Figure 11:
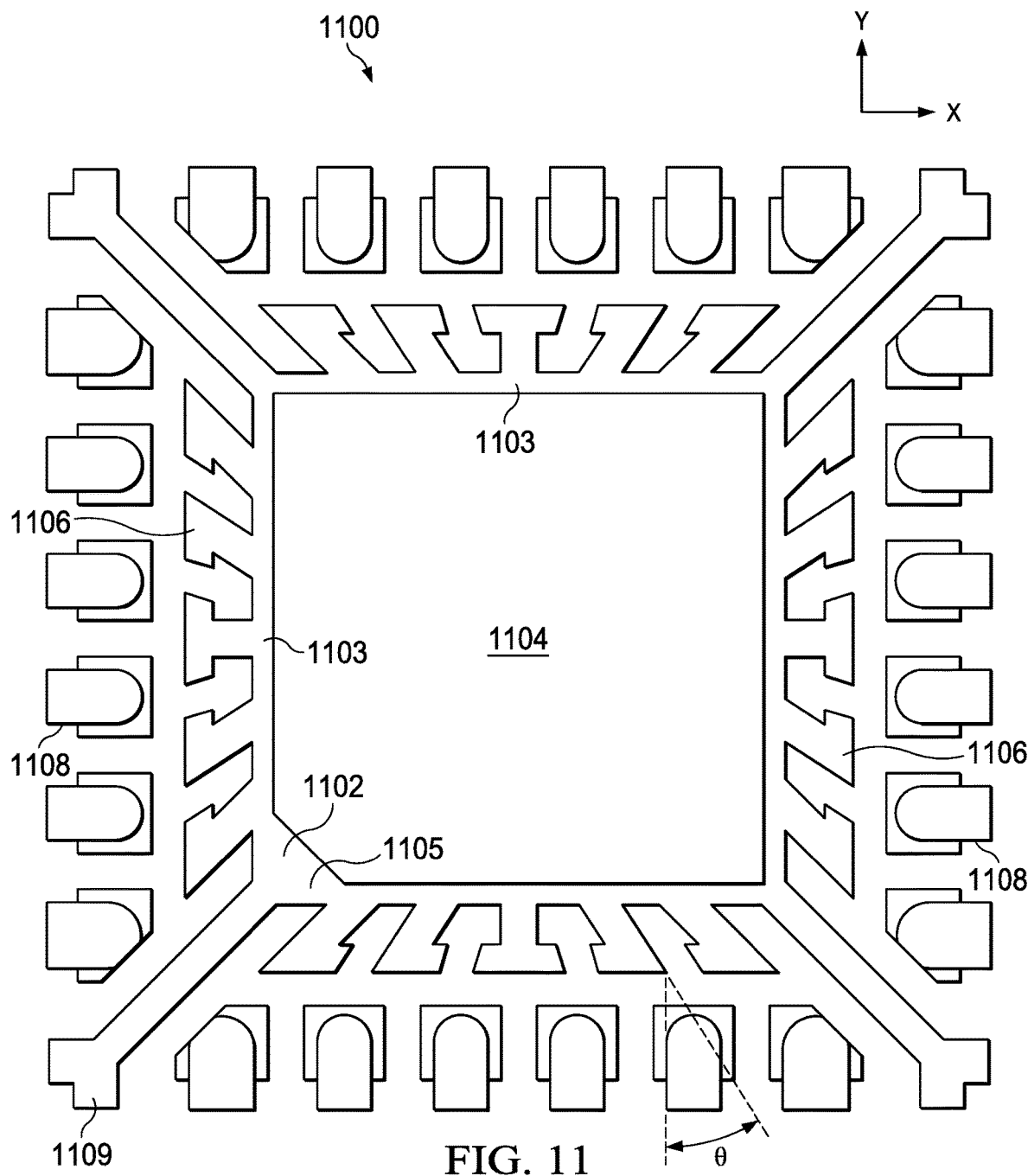
FIG. 11 is a partial top plan view of a further example lead frame with cantilevered die pad leads according to another embodiment.

Referring also to FIGS. 9-11, the example lead frame 101 in FIGS. 1 and 3-8 includes adjacent first leads 106 at an angle θ to one another, although not a requirement of all possible implementations. FIG. 9 shows a single die area portion of another electronic device 900 during fabrication processing following die attach (204 in FIG. 2) prior to wire bonding (206 in FIG. 2), which includes another example lead frame with a die attach pad 902 with four sides 903, and a semiconductor die 904 mounted to a die support portion 905 of the die attach pad 902. The die attach pad 902 also includes cantilevered first leads 906 extending from the respective sides 903, and the device 900 includes second leads 908 spaced apart from the die attach pad 902. This example also includes ground connection structures 909 that individually extend towards corresponding corners of the device 900. The features and structures 902, 903, 904, 905, 906, 908 and 909 generally correspond with the respective features and structures 102, 103, 104, 105, 106, 108 and 109 described above in connection with FIGS. 1 and 3-8. In the example of FIG. 9, the first leads 906 are angled with respect to the X and Y directions (e.g., angle θ), but have different shapes including certain of the first leads 906 with cantilevered ends connected to one another, and generally have different shapes.

FIG. 10 shows another example lead frame in an electronic device 1000 with cantilevered die pad leads according to a further embodiment, with a die attach pad 1002 having four sides 1003, and a semiconductor die 1004 mounted to a die support portion 1005 of the die attach pad 1002. The die attach pad 1002 also includes cantilevered first leads 1006 extending from the respective sides 1003, and the device 1000 includes second leads 1008 spaced apart from the die attach pad 1002. This example also includes ground connection structures 1009 that individually extend towards corresponding corners of the device 1000. The features and structures 1002, 1003, 1004, 1005, 1006, 1008 and 1009 generally correspond with the respective features and structures 102, 103, 104, 105, 106, 108 and 109 described above in connection with FIGS. 1 and 3-8. In the example of FIG. 10, however, the first leads 1006 extend outward from the respective sides 1003 along the corresponding one of the X and Y directions, and have generally rectangular shapes.

Another example electronic device 1100 is shown in FIG. 11, including another example lead frame with cantilevered die pad leads according to a further embodiment. This example includes a die attach pad 1102 with four sides 1103, and a semiconductor die 1104 mounted to a die support portion 1105 of the die attach pad 1102. The die attach pad 1102 also includes cantilevered first leads 1106 extending from the respective sides 1103, and the device 1100 includes second leads 1108 spaced apart from the die attach pad 1102. This example also includes ground connection structures 1109 that individually extend towards corresponding corners of the device 1100. The features and structures 1102, 1103, 1104, 1105, 1106, 1108 and 1109 generally correspond with the respective features and structures 102, 103, 104, 105, 106, 108 and 109 described above in connection with FIGS. 1 and 3-8. The example of FIG. 11 includes adjacent first leads 1106 that extend outward from the respective sides 1103 at angles θ to the corresponding one of the X and Y directions. The first leads 1106 in FIG. 11 also include widened end portions, some of which include an end portion that extends outward from the cantilevered base portion in one direction from the base portion, and others include an end portion that extends outward from the cantilevered base portion into directions to form a T shape.

Many other lead frame shapes and configurations can be used which include cantilevered first leads that extend outward from a die support area of the die attach pad to provide mold interlock features that facilitate adhesion between the molded material of the package structure and the lead frame. These features help to reduce or eliminate package delamination. Moreover, these aspects of the novel lead frame and packaged electronic device examples presented a significant cost reduction with plating and/or additional lead frame dimples, while enhancing immunity to package delamination. This solution enables process simplification and control considering the lead frame finish.

The above examples are merely illustrative of several possible implementations of various aspects of the present disclosure, wherein equivalent alterations and/or modifications will occur to others skilled in the art upon reading and understanding this specification and the annexed drawings. Modifications are possible in the described examples, and other implementations are possible, within the scope of the claims.

What is claimed is:

1. An electronic device, comprising:
a package structure, including a first side, a second side spaced apart from the first side along a first direction, a third side, and a fourth side spaced apart from the third side along a second direction, the first and second directions being orthogonal to one another;
a die attach pad enclosed by the package structure, the die attach pad including a set of cantilevered first leads, respective ones of the first leads extending outward from a side of the die attach pad within the package structure;
a set of second leads spaced apart from the die attach pad, respective ones of the second leads exposed along a corresponding one of the first, second, third, and fourth sides of the package structure;
a semiconductor die enclosed by the package structure, the semiconductor die including a first side mounted to the die attach pad, and a second side with conductive bond pads electrically connected to a circuit or component of the semiconductor die;
a set of first bond wires connected between respective bond pads of the semiconductor die and at least some of the first leads of the die attach pad; and
a set of second bond wires connected between respective further bond pads of the semiconductor die and at least some of the second leads.

2. The electronic device of claim 1, wherein the die attach pad includes first leads that extend outward from multiple sides of the die attach pad within the package structure.

3. The electronic device of claim 1, wherein some of the first leads extend outward from the side of the die attach pad along one of the first direction and the second direction, and wherein others of the first leads extend outward from the side of the die attach pad at a non-zero angle to the one of the first direction and the second direction.

4. The electronic device of claim 1,
wherein the respective first leads and the respective second leads include a plated side;
wherein the first bond wires are connected to the plated sides of the respective first leads of the die attach pad; and
wherein the second bond wires are connected to the plated sides of the respective second leads.

5. The electronic device of claim 4, wherein the plated sides of the respective first leads and the plated sides of the respective second leads include nickel-palladium-gold.

6. The electronic device of claim 4, wherein non-plated sides of the respective first leads and non-plated sides of the respective second leads include a roughened surface.

7. The electronic device of claim 4, wherein the die attach pad includes a recess between adjacent ones of the cantilevered first leads.

8. The electronic device of claim 7, wherein the die attach pad includes a second recess between the cantilevered first leads and a die support portion of the die attach pad.

9. The electronic device of claim 1,
wherein sides of the respective first leads and sides of the respective second leads include a roughened surface;
wherein the first bond wires are connected to the roughened surfaces of the respective first leads of the die attach pad; and
wherein the second bond wires are connected to the roughened surfaces of the respective second leads.

10. The electronic device of claim 1, wherein the die attach pad includes a recess between adjacent ones of the cantilevered first leads.

11. The electronic device of claim 1, wherein the die attach pad includes a recess between the cantilevered first leads and a die support portion of the die attach pad.

12. A lead frame, comprising:
a die attach pad, including a set of cantilevered first leads, respective ones of the first leads extending outward from a side of the die attach pad; and
a set of second leads spaced apart from the die attach pad.

13. The lead frame of claim 12, wherein the die attach pad includes first leads that extend outward from multiple sides of the die attach pad.

14. The lead frame of claim 12, wherein some of the first leads extend outward from the side of the die attach pad along one of a first direction and a second direction, and wherein others of the first leads extend outward from the side of the die attach pad at a non-zero angle to the one of the first direction and the second direction.

15. The lead frame of claim 12,
wherein the respective first leads and the respective second leads include a plated side;
wherein first bond wires are connected to the plated sides of the respective first leads of the die attach pad; and
wherein second bond wires are connected to the plated sides of the plated sides of the respective second leads.

16. The lead frame of claim 12, wherein the die attach pad includes a recess between adjacent ones of the cantilevered first leads.

17. The lead frame of claim 12, wherein the die attach pad includes a recess between the cantilevered first leads and a die support portion of the die attach pad.

18. A method, comprising:
providing a lead frame that includes a die attach pad with a set of cantilevered first leads that extend outward from a side of the die attach pad, and a set of second leads spaced apart from the die attach pad;
performing a die attach process that attaches a semiconductor die to the die attach pad of the lead frame;
performing a wire bonding process that attaches a set of first bond wires between respective bond pads of the semiconductor die and at least some of the cantilevered first leads of the die attach pad, and that attaches a set of second bond wires between respective further bond pads of the semiconductor die and at least some of the second leads; and
performing a molding process that encloses the semiconductor die, a portion of the die attach pad, the cantilevered first leads, first portions of the second leads, and the first and second bond wires in a package structure that exposes second portions of the second leads.

19. The method of claim 18, further comprising:
performing a package singulation process that separates respective ones of the second leads from one another, and that exposes the second portions of the second leads along a side of the package structure.

20. The method of claim 18, further comprising:
plating a side of the lead frame before performing the die attach process.

* * * * *